(12) United States Patent
Wu et al.

(10) Patent No.: US 8,120,140 B2
(45) Date of Patent: Feb. 21, 2012

(54) ISOLATION STRUCTURE AND FORMATION METHOD THEREOF

(75) Inventors: Ming-Tsung Wu, Hualien County (TW);
Shih-Ping Hong, Taichung (TW);
Chun-Min Cheng, Kaohsiung (TW);
Yu-Chung Chen, Taipei (TW);
Han-Hui Hsu, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 239 days.

(21) Appl. No.: 12/470,587

(22) Filed: May 22, 2009

(65) Prior Publication Data
US 2010/0295147 A1   Nov. 25, 2010

(51) Int. Cl.
*H01L 21/70* (2006.01)

(52) U.S. Cl. . 257/510; 257/506; 257/521; 257/E21.548; 438/248; 438/391; 438/701

(58) Field of Classification Search .................. 257/506, 257/E29.02, E21.546, 510, E21.548, 521; 438/424, 248, 391, 701
See application file for complete search history.

(56) References Cited

U.S. PATENT DOCUMENTS

| | | | | |
|---|---|---|---|---|
| 5,679,599 A * | 10/1997 | Mehta | .......................... | 438/425 |
| 6,140,207 A * | 10/2000 | Lee | .............................. | 438/427 |
| 6,207,532 B1 * | 3/2001 | Lin et al. | ....................... | 438/424 |
| 6,274,457 B1 * | 8/2001 | Sakai et al. | .................... | 438/424 |
| 7,508,048 B2 * | 3/2009 | Kang et al. | .................... | 257/500 |
| 2009/0029523 A1 * | 1/2009 | Seo et al. | ...................... | 438/425 |
| 2009/0261448 A1 * | 10/2009 | Mishra et al. | ................. | 257/506 |

* cited by examiner

*Primary Examiner* — Zandra Smith
*Assistant Examiner* — Jeremy Joy
(74) *Attorney, Agent, or Firm* — Thomas|Kayden

(57) ABSTRACT

An isolation structure comprising a substrate is provided. A trench is in the substrate. A sidewall of the trench has a first inclined surface and a second inclined surface. The first inclined surface is located on the second inclined surface. The slope of the first inclined surface is different from the slope of the second inclined surface. A length of the first inclined surface is greater than 15 nanometers.

6 Claims, 17 Drawing Sheets

ISOLATION STRUCTURE AND FORMATION METHOD THEREOF

BACKGROUND OF THE INVENTION

1. Field of the Invention

The invention relates in general to an isolation structure and a formation method thereof, and more particularly to an isolation structure with trenches for insulation and a formation method thereof.

2. Description of the Related Art

Generally speaking, with the increasing integration of a memory device, intervals between memory cells in the memory device are getting smaller and smaller. Thus, the isolation between the memory cells becomes one of key factors of the memory device performance. At present, the conventional local oxidation of silicon (LOCOS) has been gradually replaced with the shallow trench isolation (STI) technology because it has the drawback of forming a bird's beak. The STI technology is mainly to etch the silicon substrate to form trenches and then fill the material, such as silicon dioxide, between the memory cells to form the isolation region.

However, as shown in FIG. 1A, in a typical STI process, a pad oxide layer 420 and a nitride layer 430 are sequentially formed on a substrate 410, and then an opening 411 is formed in the pad oxide layer 420 and the nitride layer 430. After that, a trench 413 is formed via the opening 411 to expose a part of the substrate 410. A liner oxide layer (not shown) is then formed on the exposed part of the substrate 410. Afterward, an oxide material layer 450 (in FIG. 1B) is filled in the trench 413, chemical mechanical planarization (CMP) is performed for planarization, and the pad oxide layer 420 and the nitride layer 430 are removed. Then, a thermal oxide layer 460 and a conductive layer 480 are sequentially deposited to form a structure shown in FIG. 1B. As the amount of the oxide formed at the approximately right-angle corner is always less than that formed at other parts, the thermal oxide layer 460 formed around the top corners C1 become thinner (hereinafter "top corner thinning"). Besides, divot structures 481 formed after several wet clean/strip processes also cause the top corner thinning. Therefore, the memory device formed thereafter has a reduced breakdown voltage and an increased current leakage, so that the reliability of the memory device is degraded.

Furthermore, the increase of the aspect ratio of the trench may raise the fill-in issue due to the shrink of the dimension of the memory device to accordingly reduce the pitch of the memory device and the width of the trench. As shown in FIG. 1C, spacers 440 are formed on the sidewalls of the pad oxide layer 420 and the nitride layer 430 before etching the trench 413', so that the top corner thinning might be avoided and the dimension of the top corners C2 can be pre-designed. However, as a result of forming the spacers 440, the aspect ratio of the trench 413' becomes D/W, which apparently increases under the presupposition of the same depth D with respect to the trench 413 in FIG. 1A. Thus, as shown in FIG. 1D, when the oxide material layer 450 is filled in the trench 413' through the reduced width W of the opening of the trench 413', the fill-in issue may occur. That is, the oxide material layer 450 tends to block at the opening of the trench 413', so that a void 470 may be formed easily.

SUMMARY OF THE INVENTION

The invention is directed to an isolation structure and a formation method thereof, wherein a dielectric layer can be uniformly distributed to avoid the current leakage generated due to the non-uniform thickness of the dielectric layer. In addition, the size of an opening of each trench can be effectively controlled to prevent the aspect ratio of each trench from increasing extremely. Thus, the fill-in issue that the material of the dielectric layer blocks at the opening of each trench when being filled into the trenches can be avoided.

According to a first aspect of the present invention, an isolation structure comprising a substrate is provided. A trench is in the substrate. A sidewall of the trench has a first inclined surface and a second inclined surface. The first inclined surface is located on the second inclined surface. The slope of the first inclined surface is different from the slope of the second inclined surface. A length of the first inclined surface is greater than 15 nanometers. As the length of the first inclined surface can be formed according to the thickness of a removable layer, the length of the first inclined surface ranges between 10-100 nm. Preferably, the length of the first inclined surface ranges between 15-50 nm. The removable layer can be composed of amorphous carbon, for example.

According to a second aspect of the present invention, a formation method of an isolation structure comprises the following steps. A substrate is provided. Then, a mask layer is formed on the substrate. The mask layer has a first opening exposing a portion of the substrate. After that, a first removable layer is formed on the mask layer. Then, an etching process is performed to form a first spacer structure on a side of the mask layer and to form a first trench in the substrate. A sidewall of the first trench has a first inclined surface, covered by the first spacer structure, and an exposed second inclined surface. The first spacer structure comprises the residual first removable layer, and a width of the first spacer structure is greater than 15 nanometers. As the length of the first inclined surface is formed according to the width of the first spacer structure, the length of the first inclined surface ranges between 10-100 nm. Preferably, the length of the first inclined surface ranges between 15-50 nm. The first removable layer of the first spacer structure can be composed of amorphous carbon, for example. After that, the residual first removable layer is removed. Then, a dielectric layer is filled into the first trench after the first removable layer is removed.

According to a third aspect of the present invention, an isolation structure comprising a substrate is provided. Several trenches are in the substrate. A sidewall of each trench has a first inclined surface and a second inclined surface. The first inclined surface is located on the second inclined surface. The slope of the first inclined surface is different from the slope of the second inclined surface. The substrate has a first region and a second region. The profile of each trench in the first region is different from the profile of each trench in the second region. A length of each first inclined surface in the first region and the second region is greater than 15 nanometers.

The invention will become apparent from the following detailed description of the preferred but non-limiting embodiments. The following description is made with reference to the accompanying drawings.

DETAILED DESCRIPTION OF THE INVENTION

The invention mainly provides an isolation structure and a formation method thereof. The isolation structure includes a substrate. A trench is in the substrate. A sidewall of the trench has a first inclined surface and a second inclined surface. The first inclined surface is located on the second second inclined surface. The slope of the first inclined surface is different the slope of the second inclined surface. A length of the first inclined surface is greater than 15 nanometers. As the length of the first inclined surface can be formed according to the width of a spacer structure which at least has a removable layer, the length of the first inclined surface can range between 10-100 nm. Preferably, the length of the first inclined surface ranges 15-50 nm. The removable layer can be an ashable layer which is composed of amorphous carbon or polymer, for example.

In this invention, a dielectric layer can be uniformly distributed over the upper surface of the substrate and the first inclined surface by changing the length of the first inclined surface, so that the current leakage generated due to the non-uniform thickness of the dielectric layer can be avoided. In addition, the size of the opening of the trench can be effectively controlled under the precondition of forming the first inclined surface. Thus, even if lots trenches are located densely in the substrate, the invention still can avoid the fill-in issue that the material of the dielectric layer blocks the openings of the trenches when being filled into the trenches as the aspect ratio of each trench would not increase extremely. Furthermore, the formation of voids in the trenches due to the block of the dielectric layer at the openings can be avoided.

The isolation structure and the formation method thereof will be described in detail in the following with reference to several embodiments and the accompanying drawings. However, a person having ordinary skills in the art understands that the drawings and the texts are made for the illustrative and the invention is not limited thereto.

First Embodiment

Figure 2A:
FIGS. 2A to 2H show processes of a formation method of an isolation structure according to a first embodiment of the invention.
Figure 2B:
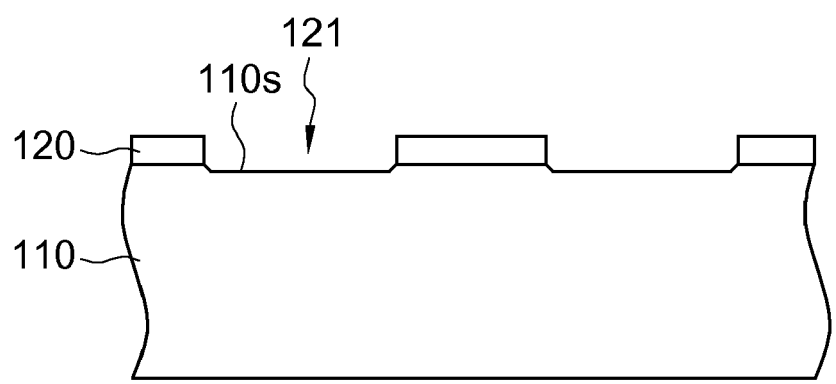
Figure 2C:
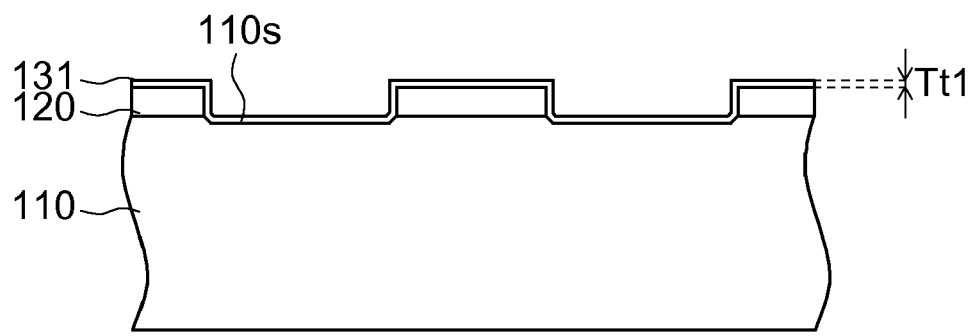
Figure 2D:
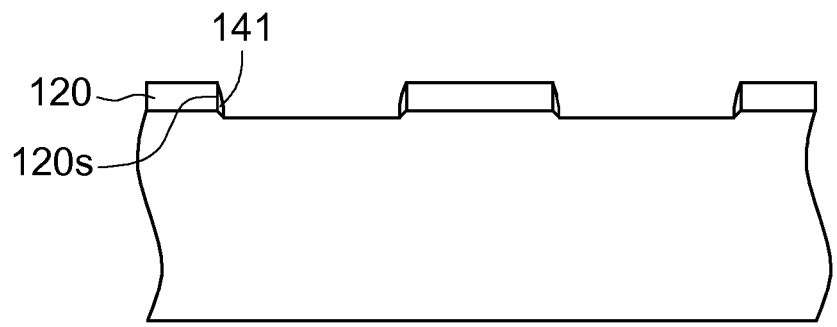
Figure 2E:
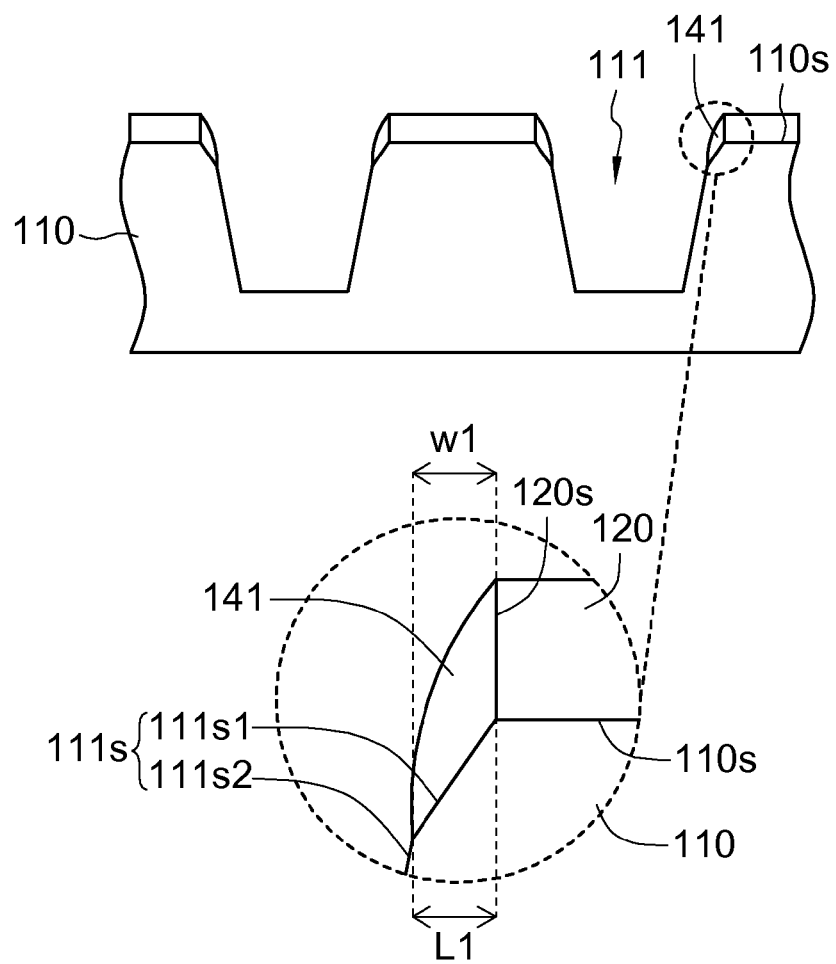
Figure 2F:
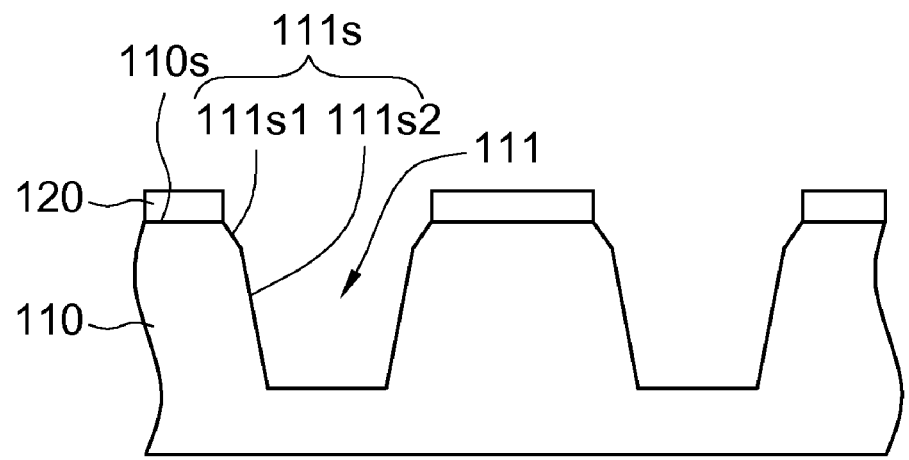
Figure 2G:
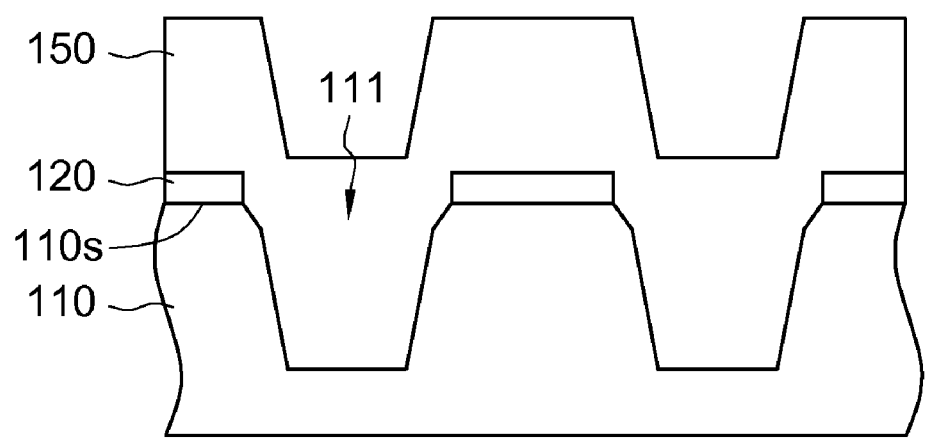
Figure 2H:
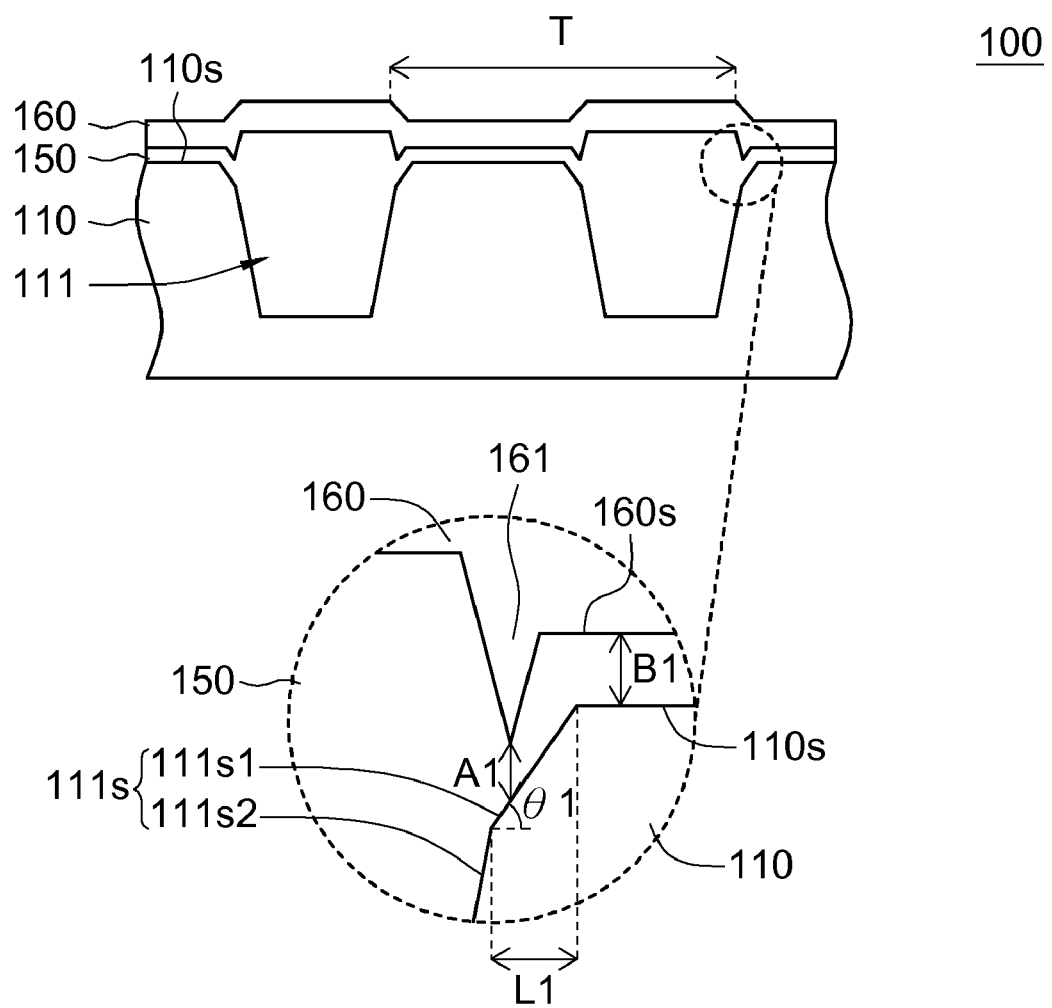
Figure 3:
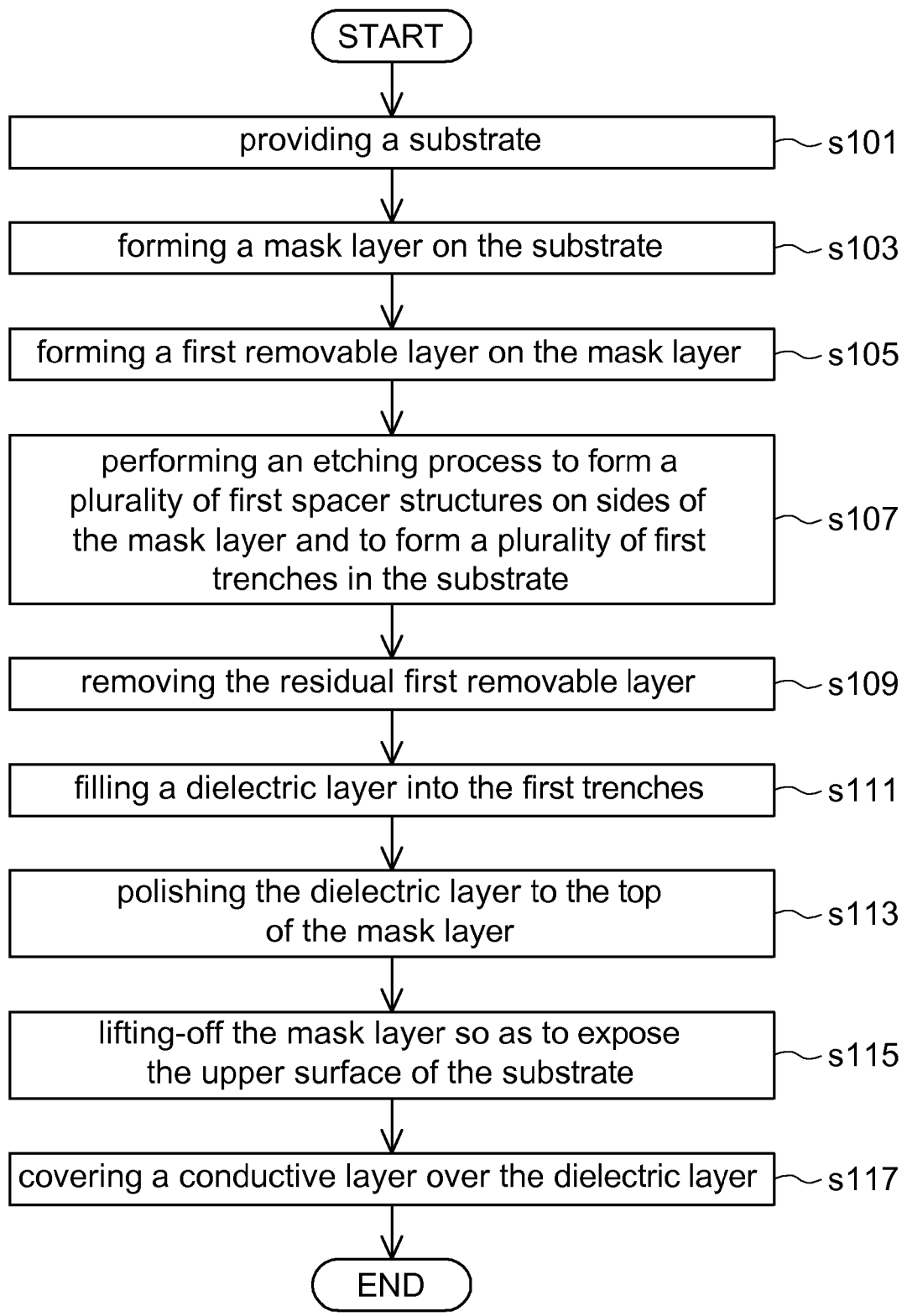
FIG. 3 is a flow chart showing steps of the formation method of the isolation structure.

Referring to FIGS. 2A to 2H and FIG. 3, processes of a formation method of an isolation structure according to a first embodiment of the invention are shown in FIGS. 2A to 2H, and a flow chart showing steps of the formation method of the isolation structure is shown in FIG. 3. The isolation structure of this embodiment can be formed in memory structures to provide the insulation function. The formation method of the isolation structure includes the following steps.

First, in the step s101, a substrate 110, which can be a silicon substrate or other type of substrate, is provided, as shown in FIG. 2A.

Figure 5A:
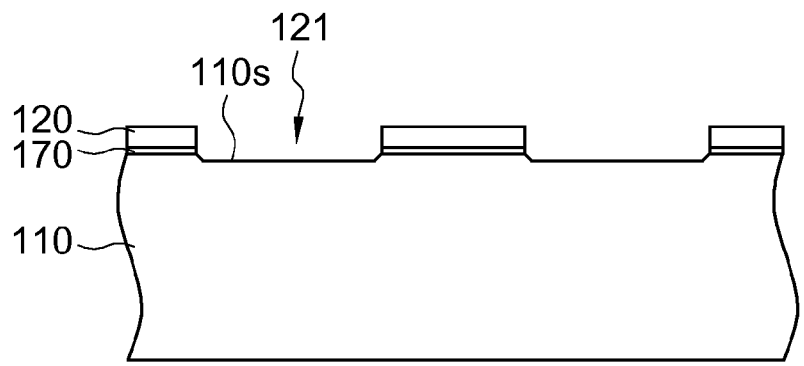
FIGS. 5A to 5C show processes of a formation method of an isolation structure according to a second embodiment of the invention.

Next, as shown in FIG. 2B, a mask layer 120 is formed on the substrate 110 in the step s103. The mask layer 120 can be, for example, formed of silicon nitride and has first openings 121 exposing a portion of the substrate 110. The first openings 121 are formed in the mask layer 120 by lithographic and etch processes. Sometimes, recesses with inclined surfaces may be formed in the substrate 110 because of overetching. In addition, in order to prevent the stress or adhesion generated between the substrate 110 and the mask layer 120, a buffer layer, such as the layer 170 shown in FIG. 5A, is preferably formed between the substrate 110 and the mask layer 120 and is composed of oxide.

Then, in the step s105, a first removable layer 131 with a thickness Tt1 is formed on the mask layer 120 and a portion of an upper surface 110s of the substrate 110 (i.e., the upper surface 110s of the substrate 110 exposed from the first openings 121), as shown in FIG. 2C. The first removable layer 131 is preferably composed of amorphous carbon by way of chemical vapor deposition (CVD). The material of the amorphous carbon is a hydrocarbon compound, and the first removable layer 131 composed of the hydrocarbon compound can be removed by the typical dry-wet strip process. In addition, the amorphous carbon has the high selectivity ratio so as to provide the good etch-resisting property as compared with the oxide or polymer.

Next, the step s107 is performed. As shown in FIG. 2D, an etching process is performed to form several first spacer structures 141 including the residual first removable layer 131 on sides 120s of the mask layer 120. In the present embodiment, each first spacer structure 141 covers the inclined surface of the recess only. The first spacer structure 141 may cover both a part of the bottom surface and the inclined surface of the recess while the thickness Tt1 of the first removable layer 131 is increased. Then, an anisotropic etching process is performed. The etching capability of the anisotropic etching process in the longitudinal direction is greater than that in that in the transverse direction. Thus, first trenches 111 are formed in the substrate 110, as shown in FIG. 2E.

Then, as shown in FIG. 2F, the residual first removable layer 131 (i.e., the first spacer structure 141) is removed in the step s109 by way of the dry-wet strip. As the first removable layer 131 is composed of the amorphous carbon in the illustrated example, the carbon in the amorphous carbon is removed by becoming the carbon dioxide as the dry etching process is performed. In addition, the polymer and the particles remained on the surface are removed by the wet etching process.

Next, in the step s111, a dielectric layer 150 is filled into the first trenches 111 by the high density plasma (HDP) technology, as shown in FIG. 2G. Generally, some wet clean processes are performed to clean the structure. However, performing the wet clean processes on the structure might cause the oxide loss easily, such that the substrate 110 might be exposed. Preferably, before the dielectric layer 150 is filled, a liner layer (not shown) is provided to cover over the structure in FIG. 2F to repair and improve the surface of the substrate 110. As mentioned above, the first spacer structure 141 might cover both a part of the bottom surface and the inclined surface of the recess. In other words, the first spacer structure 141 covers a surface of the substrate 110 with two different slopes. While the surface of the substrate 110 with two different slopes is exposed after the oxide loss occurs, the process of forming the liner layer smoothes and rounds the exposed surface. Therefore, the exposed surface (i.e., the first inclined surface 111s1) of the substrate 110 has only one slope. On the contrary, if the surface of the substrate with two different slopes is not exposed to be smoothed and rounded, the exposed surface (i.e., the first inclined surface 111s1) is composed of two surfaces with two different slopes. It is to be noted that the first removable layer 131 covers the first inclined surface 111s1 to prevent it from being eroded in the etching step, and is removed from the sides 120s of the mask layer 120 before the step of filling the dielectric layer 150. The openings of the first trenches 111 are enlarged relatively when the dielectric layer 150 is filled because the first removable layer 131 is removed. Consequently, the fill-in issue due to the extremely increase of the aspect ratio of the trench would not occur.

Then, in the step s113, the dielectric layer 150 is polished to the top of the mask layer 120 by way of chemical mechanical polishing. Next, in the step s115, the mask layer 120 is lift-off by using the hot phosphoric acid so as to expose the upper surface 110s of the substrate 110. Then, in the step s117, a conductive layer 160 is covered over the dielectric layer 150 so that an isolation structure 100 is formed, as shown in FIG. 2H.

The structural features of the isolation structure 100 (FIG. 2H) formed by the formation method mentioned above will be disclosed in the following. The isolation structure 100 includes the substrate 110, the dielectric layer 150 and the conductive layer 160. The substrate 110 has the first trenches 111. The first sidewall 111s of each of the first trenches 111 has the first inclined surface 111s1 and the second inclined surface 111s2 which have different slopes. The first inclined surface 111s1 is located on the second inclined surface 111s2. That is, the first inclined surface 111s1 is positioned between the upper surface 110s of the substrate 110 and the second inclined surface 111s2 of each first trench 111, and the first inclined surface 111s1 is adjacent to the upper surface 110s of the substrate 110. The length L1 of the first inclined surface 111s1 can be greater than 15 nanometers. In the present embodiment, the length L1 is defined as the length that the first inclined surface 111s1 is projected onto a horizontal plane.

In addition, the dimensions of the isolation structure 100 can reach the following specification according to the thickness control of the first removable layer 131 (see FIG. 2C). The isolation structure 100 is a periodic structure with a pitch T. The definition of the pitch T can include one first trench 111 and one bump portion projecting with respect to the first trench 111, as shown in FIG. 2H. Taking the isolation structure 100 disposed in the array area of the memory structure for example, a ratio of the length L1 of the first inclined surface 111s1 to the pitch T of the isolation structure can be greater than 0.06, and an angle θ1 between the first inclined surface 111s1 and the horizontal plane ranges between 0 and 60 degrees.

Figure 1A:
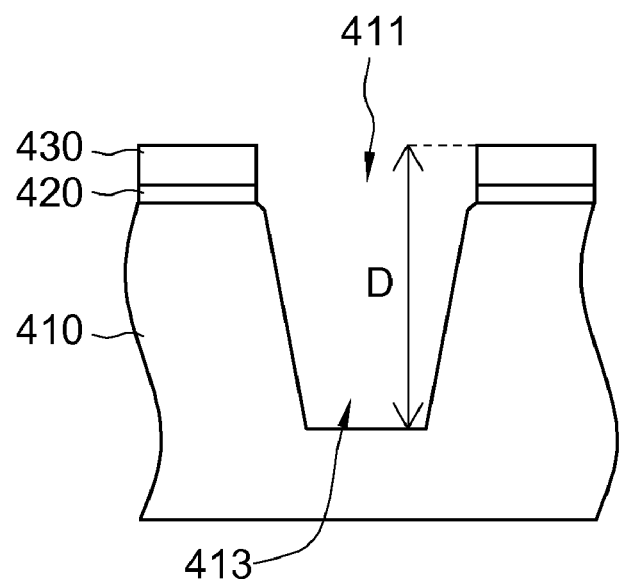
FIG. 1A (Prior Art) is a schematic illustration showing a conventional STI structure process.
Figure 1B:
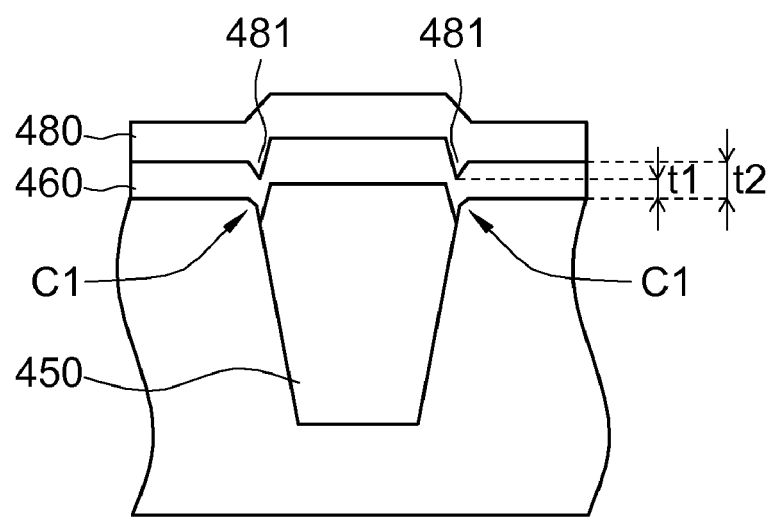
FIG. 1B (Prior Art) is a schematic illustration showing the top corner thinning resulting from the STI structure process shown in FIG. 1A.
Figure 1C:
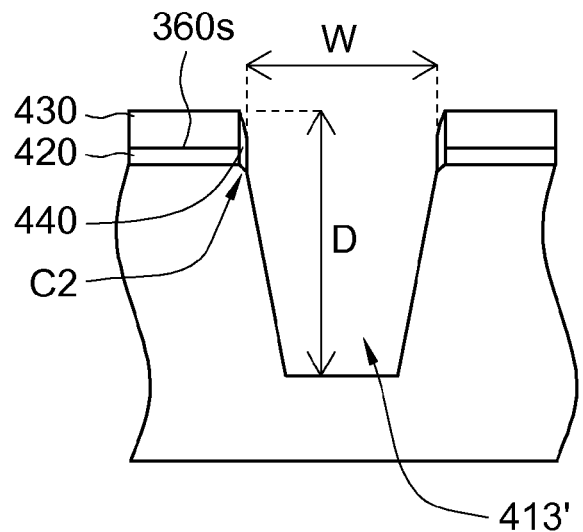
FIG. 1C (Prior Art) is a schematic illustration showing the STI structure with spacers.
Figure 1D:
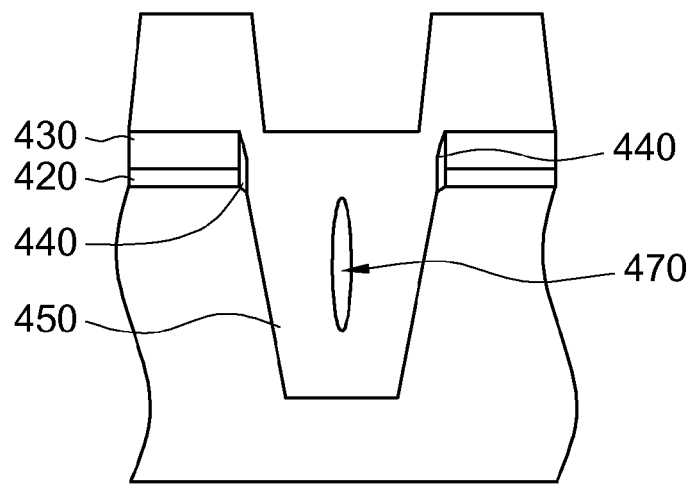
FIG. 1D (Prior Art) is a schematic illustration showing the STI structure shown in FIG. 1C with a void.

The dielectric layer 150 is on the first trenches 111. More specifically, the dielectric layer 150 covers over the substrate 110 and is filled into the first trenches 111. The conductive layer 160 is on the dielectric layer 150. The lower surface 160s of the conductive layer 160 has the projections 161, each of which protrudes toward the substrate 110 and surrounds at the position corresponding to the first inclined surface 111s1. If the distance between the projection 161 and the first inclined surface 111s1 (i.e., the thickness of the dielectric layer 150 therebetween) is A1, and the distance between the upper surface 110s of the substrate 110 and the lower surface 160s of the corresponding conductive layer 160 (i.e., the thickness of the dielectric layer 150 therebetween) is B1, A1/B1 can reach 70% to 80%. Therefore, compared with the structure shown in FIG. 1B, the dielectric layer 150 can be distributed more uniformly to prevent the top corner thinning, so that the current leakage can be avoided and the memory device having the isolation structure 100 has excellent reliability. Moreover, as the first spacer structure 141 (shown in FIG. 2E) is composed of removable material, the aspect ratio of each first trench 111 can be effectively controlled to avoid the fill-in issue.

Second Embodiment

The difference between the second and first embodiments resides in the structure of spacer structures, the disposition of a buffer layer and the formation method thereof. The same components will refer to the same numbers and detailed descriptions thereof will be omitted.

Figure 4:
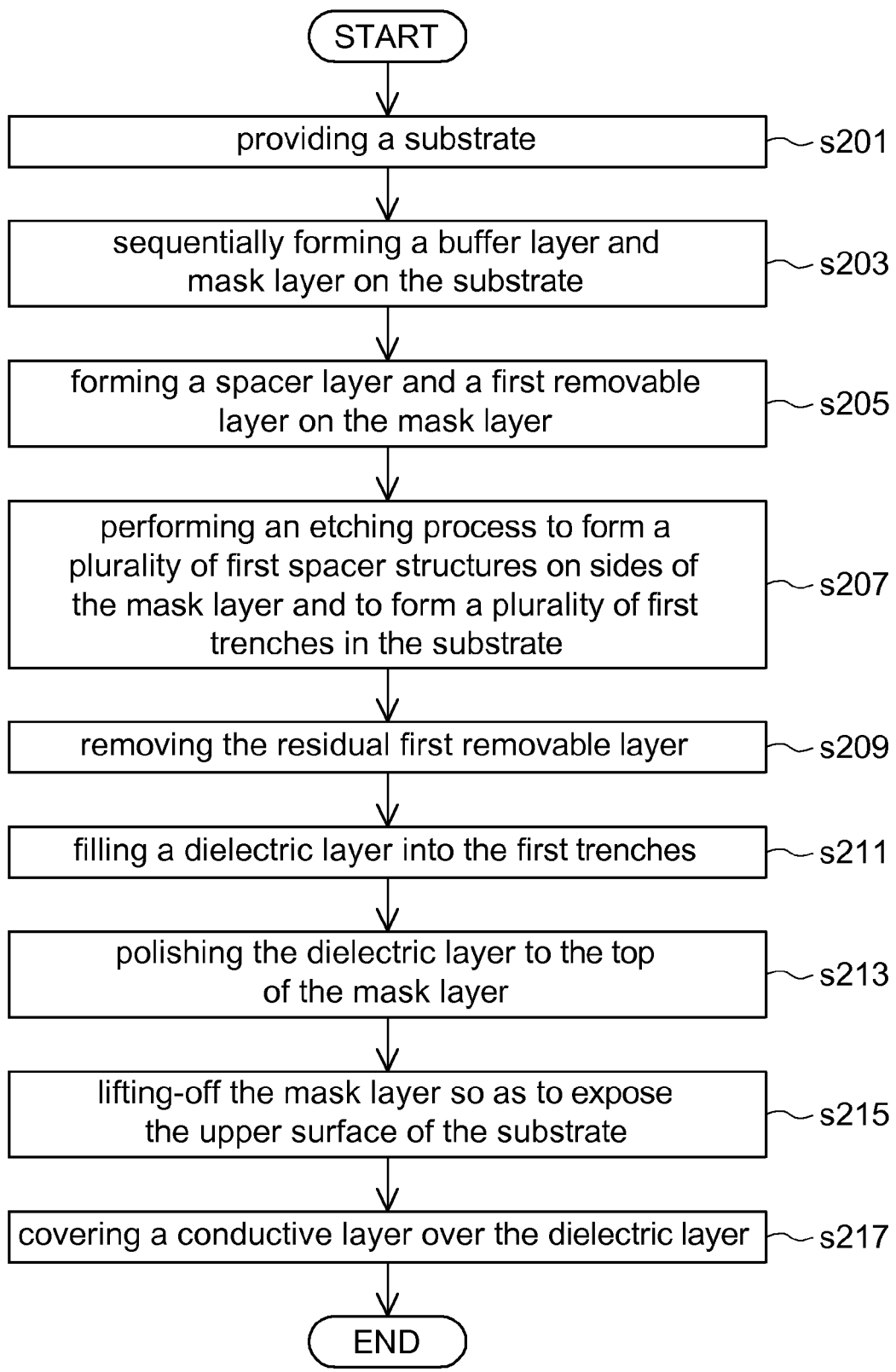
FIG. 4 is another flow chart showing steps of the formation method of the isolation structure.

Referring to FIG. 4, another flow chart showing steps of the formation method of the isolation structure is illustrated. Basically, the steps s201~s217 in FIG. 4 according to the second embodiment are similar to the steps s101~s117 in FIG. 3 according to the first embodiment except the steps s203 and s205, and the steps s201 and s207~s217 are not repeatedly described herein.

After the step s201, the step s203 is performed to form a buffer layer 170 and a mask layer 120 sequentially on the substrate 110, as shown in FIG. 5A. The buffer layer 170 and the mask layer 120 have first openings 121. The buffer layer 170 composed of oxide is used for preventing the stress or adhesion from being generated between the substrate 110 and the mask layer 120.

After that, the step s205 is performed. A spacer layer 191 and a first removable layer 131 are sequentially formed on the mask layer 120 and a portion of the upper surface 110s of the substrate 110 to form a structure shown in FIG. 5B. The total thickness of the spacer layer 191 and the first removable layer 131 is Tt2. The total thickness Tt2 herein is used for deciding the width of the spacer structure as being described in the first embodiment, so that the length of the first inclined surface can be determined. The spacer layer 191 is composed of, for example, oxide.

Figure 5B:
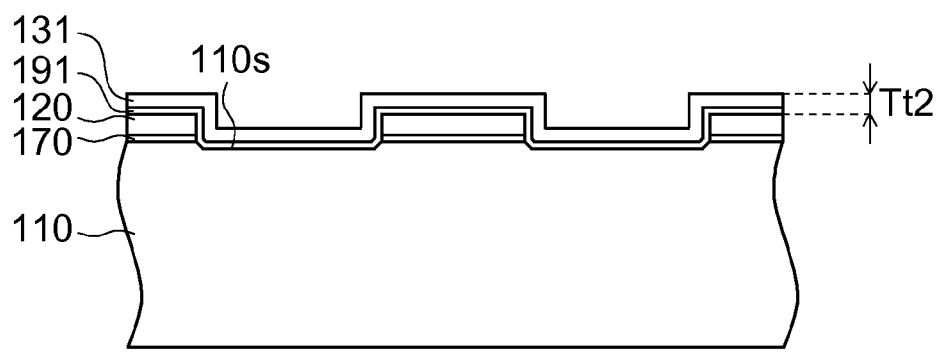
Figure 5C:
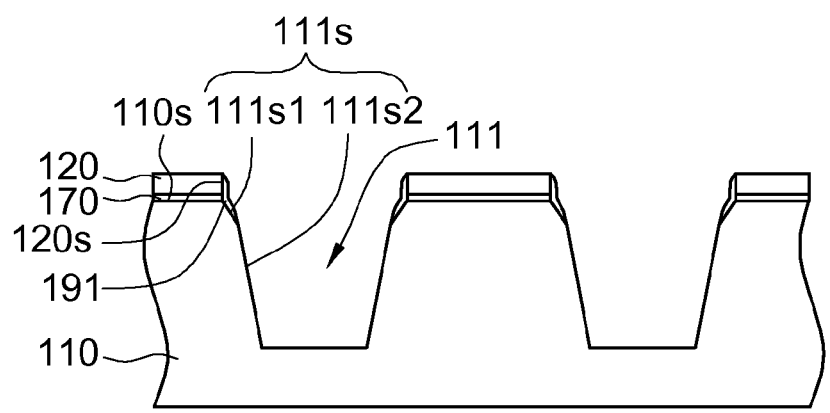

Then, the steps s207, s209 are performed on the structure shown in in FIG. 5B to etch the first removable layer 131 by oxygen ($O_2$), argon (Ar), chlorine ($Cl_2$), and nitrogen ($N_2$), to etch the spacer layer 191 by F-based gas, such as $CF_4$, $CHF_3$, oxygen ($O_2$), argon (Ar), chlorine ($Cl_2$), and nitrogen ($N_2$), to remove the first removable layer 131 and to form the first trenches 111. The steps of depositing the first removable layer 131, etching the first removable layer 131 and forming the first trenches 111 are, for example, performed in different chambers. A structure having only a part of the spacer layer 191 (i.e., the first spacer structure) is shown in FIG. 5C. The residual spacer layer 191 is not removed and is still located on the sides 120s of the mask layer 120 and the buffer layer 170 to cover the first inclined surface 111s1 of each first trench 111. Compared with a structure having trenches and spacer structures formed by an unremovable layer with thickness Tt2, the aspect ratio of each first trench 111 of the embodiment is smaller to avoid the fill-in issue because of removing the first removable layer 131.

After that, the steps s211, s213, s215 and s217 are performed on the structure in FIG. 5C. Accordingly, the isolation structure can be formed without the top corner thinning and fill-in issue. The detailed descriptions are not repeatedly described herein.

Although the steps of depositing the first removable layer 131, etching the first removable layer 131 and forming the first trenches 111 are illustrated by being performed in different chambers, these steps can be performed in a plasma etch chamber by plasma process when the conditions stated below are met.

The first removable layer 131 is composed of, for example, polymer. During the step of depositing the first removing layer 131, a mixture of several kinds of gas, such as $CF_4$, $CH_2F_2$, Ar and He, are filled in the plasma etch chamber at a pressure approximately between 3~100 mTorr. The flow rate of $CF_4$, $CH_2F_2$, Ar and He are approximately between 0~100 sccm, 0~200 sccm, 0~400 sccm and 0~400 sccm, respectively. The deposition rate of the first removable layer 131 is approximately between 100~2000 A/min. The power for depositing the first removable layer 131 is between 100~1000 W by using TCP RF power or between 30~800 W by using bias RF power.

Furthermore, during the step of etching the first removing layer 131, a mixture of several kinds of gas, such as $CF_4$, $CH_2F_2$, $CHF_3$, Ar and He, are filled in the plasma etch chamber at a pressure approximately between 3~50 mTorr. The flow rate of $CF_4$, $CH_2F_2$, $CHF_3$, Ar and He are between 0~100 sccm, 0~200 sccm, 0~200 sccm, 0~400 sccm, and 0~400 sccm, respectively. The power for etching the first removable layer 131 is between 100~800 W by using TCP RF power or between 30~500 W by using bias RF power.

Thus, the isolation structure, such as the isolation structure 100 shown in FIG. 2H, can be formed with the following specification. The angle θ1 between the first inclined surface 111s1 and the horizontal plane ranges between 0 and 45 degrees as the isolation structure 100 is disposed in the array area or the periphery area of the memory structure.

Third Embodiment

The difference between the third and first embodiments resides in that the method of the third embodiment is used for forming different types of trenches in different regions of a substrate. More particularly, removable layers with different thickness are respectively formed in the different regions to further obtain inclined surfaces with different lengths. The same components will refer to the same numbers and detailed descriptions thereof will be omitted.

FIGS. 6A to 6I show processes of a formation method of an isolation structure according to a third embodiment of the invention. The isolation structure of this embodiment can be formed in memory structures to provide the insulation function. The formation method of the isolation structure includes the following steps.

Figure 6A:
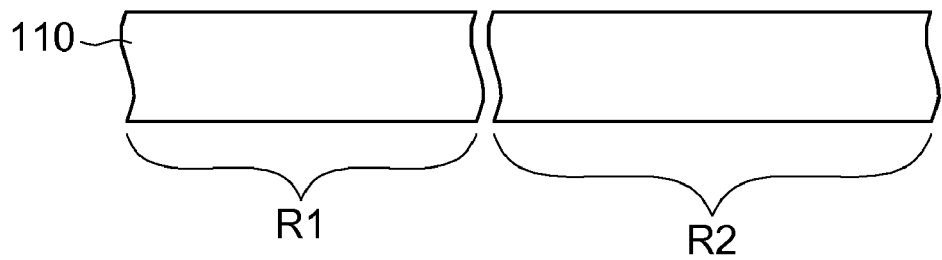
FIGS. 6A to 6I show processes of a formation method of an isolation structure according to a third embodiment of the invention.

First, as shown in FIG. 6A, a substrate 110 is provided. The substrate 110 is divided into a first region R1 (e.g., the array area in the memory structure) and a second region R2 (e.g., the periphery area in the memory structure).

Figure 6B:
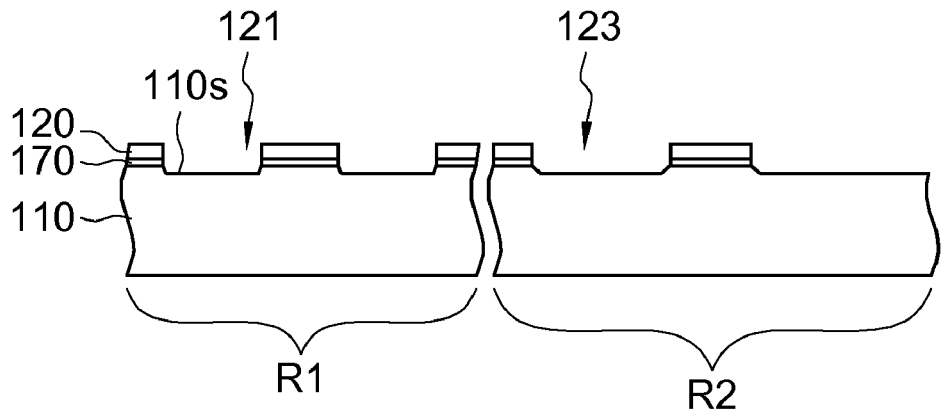

Next, the step which is similar to the step s203 in FIG. 4 is performed. That is, a buffer layer 170 and a mask layer 120 are sequentially formed on the substrate 110, as shown in FIG. 6B. The buffer layer 170 and the mask layer 120 have first openings 121 and second openings 123. The first openings 121 and the second openings 123 have different distribution densities. The first openings 121 are located in the first region R1 of the substrate 110, and the second openings 123 are located in the second region R2 of the substrate 110. The first openings 121 and the second openings 123 are formed in the mask layer 120 and the buffer layer 170 by lithographic and etch processes. Sometimes, recesses with inclined surfaces may be formed in the substrate 110 because of overetching. Generally speaking, the tilt angle of each inclined surface of the recesses in the first region R1 is mostly larger than that of the recesses in the second region R2 because of the loading effect. The buffer layer 170 composed of oxide is used for preventing the stress or adhesion from being generated between the substrate 110 and the mask layer 120.

Figure 6C:
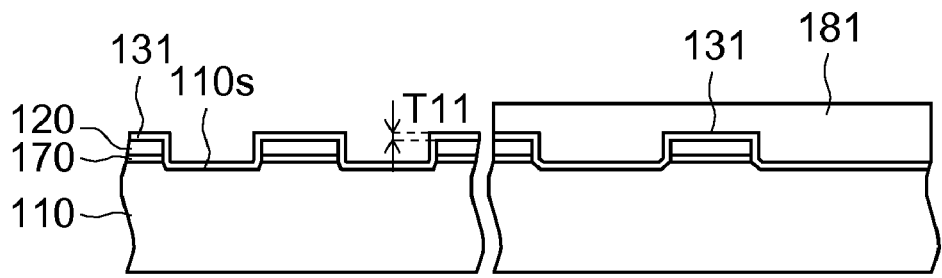

Then, the step which is similar to the step s105 in FIG. 3 is performed. That is, as shown in FIG. 6C, a first removable layer 131 having a thickness T11 is formed on the mask layer 120 and a portion of an upper surface 110s of the substrate 110. Next, a first photoresist layer 181 is formed to cover over the second region R2 in order to perform the step of forming first trenches in the first region R1 of the substrate 110.

Figure 6D:
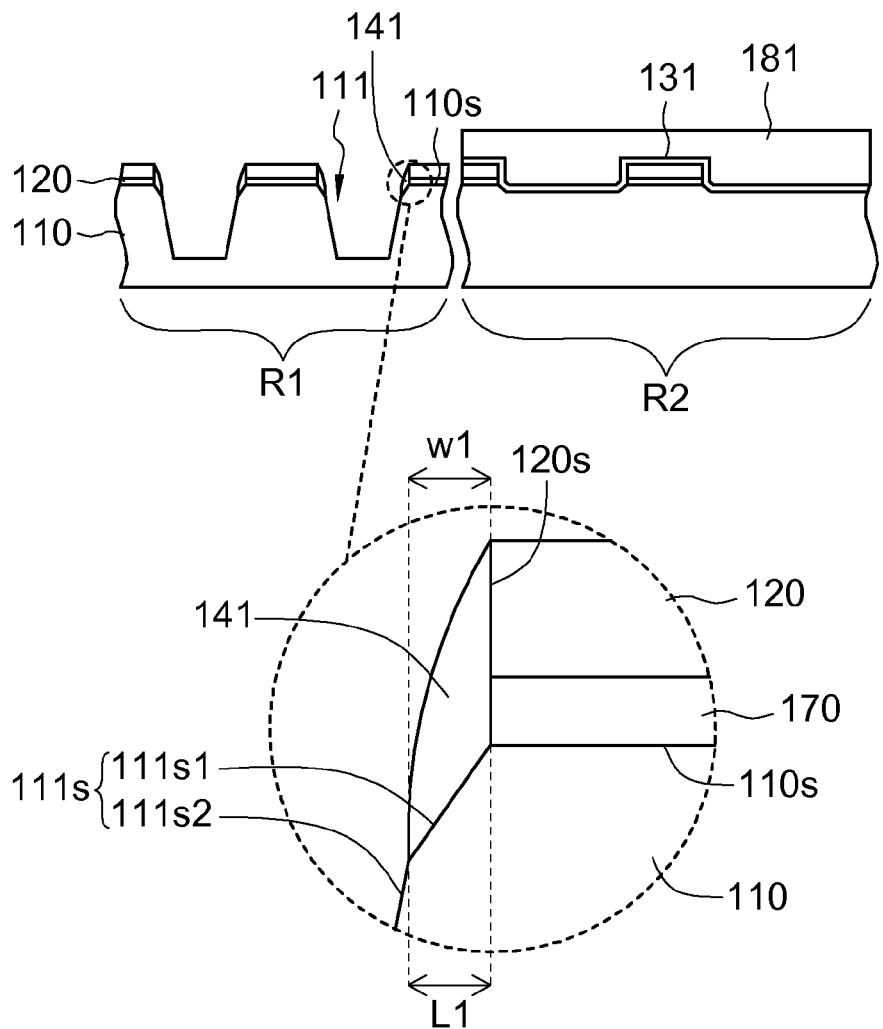

Then, as shown in FIG. 6D, the step which is similar to the step s107 in FIG. 3 is performed. That is, an anisotropic etching process is performed in the first region R1 so that first spacer structures 141 including the residual first removable layer 131 are formed on sides of the mask layer 120, and the first trenches 111 is formed in the substrate 110. A sidewall 111s of each of the first trenches 111 has a first inclined surface 111s1, covered by the first spacer structure 141, and an exposed second inclined surface 111s2. The width w1 of each first spacer structure 141 can be greater than 15 nanometers as the thickness T11 of the first removable layer 131 is greater than 150 angstroms, so that the length L1 of the first inclined surface 111s1 can be greater than 15 nanometers. In the present embodiment, the length L1 of the first inclined surface 111s1 is defined as the length that the first inclined surface 111s1 is project onto the horizontal plane.

Figure 6E:
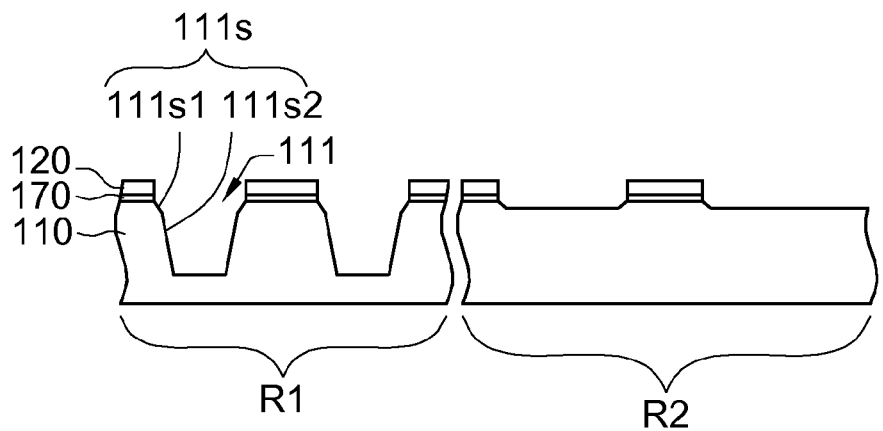

Next, as shown in FIG. 6E, the step which is similar to the step s109 in FIG. 3 is performed. That is, the residual first removable layer 131 is removed. Moreover, the first photoresist layer 181 is removed. When the first removable layer 131 is composed of the amorphous carbon, the first photoresist layer 181 and the first removable layer 131 can be simultaneously removed in the same etching step. Herein, the removed residual first removable layer 131 refers to the first removable layer 131 included in the first spacer structures 141, and the first removable layer 131 in the second region R2.

Figure 6F:
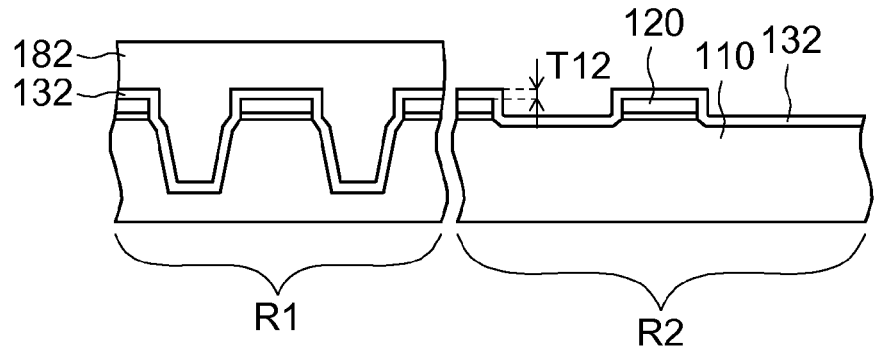
Figure 6G:
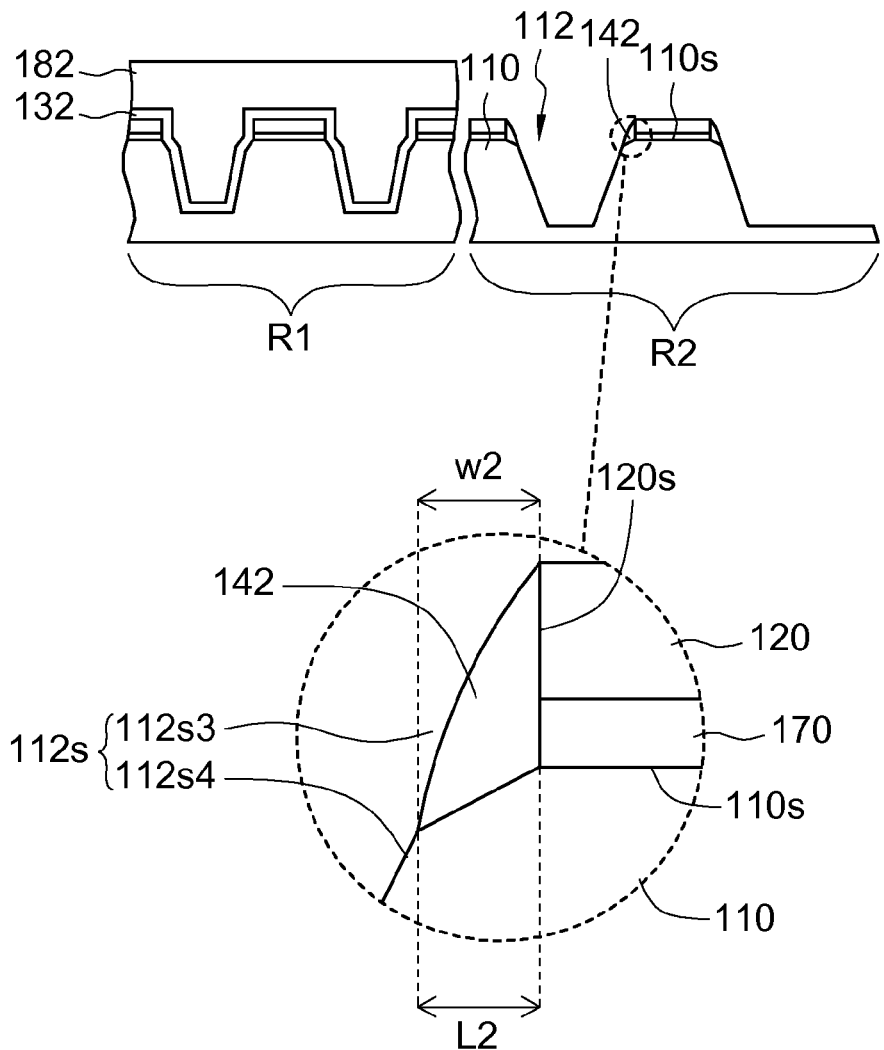
Figure 6H:
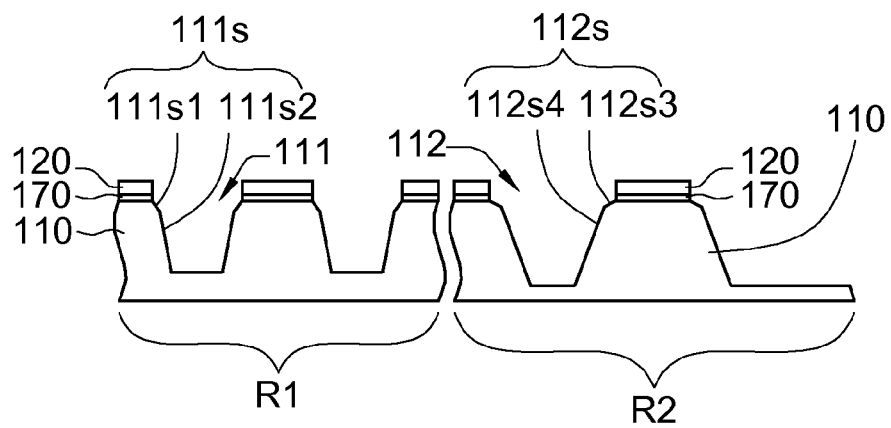

Then, forming second trenches in the second region R2 of the substrate 110 includes the following steps which are respectively similar to the the steps s105~s109. A second removable layer 132 having a thickness T12 is formed on the mask layer 120, and a second photoresist layer 182 is formed in the first region R1, as shown in FIG. 6F. Next, an anisotropic etching process is performed in the second region R2, so that second spacer structures 142 including the residual second removable layer 132 with second widths w2 are formed on the sides 120s of the mask layer 120, and the second trenches 112 are formed in the substrate 110, as shown in FIG. 6G. The sidewall 112s of each second trench 112 has a third inclined surface 112s3, covered by the second spacer structure 142, and an exposed fourth inclined surface 112s4. The width w2 of each second spacer structure 142 can be greater than 15 nanometers as the thickness T12 of the second removable layer 132 is greater than 150 angstroms, so that a length L2 of the third inclined surface 112s3 can be greater than 15 nanometers. In the present embodiment, the length L2 of the third inclined surface 112s3 is defined as the length that the third inclined surface 112s3 is project onto the horizontal plane. Of course, a person having ordinary skills in the art understands that the length L2 can be different from the length L1 by adjusting the thickness T12 of the second removable layer 132. Then, as shown in FIG. 6H, the second photoresist layer 182 and the residual second removable layer 132 (referring to the second removable layer 132 included in the second spacer structure 142 and in the first region R1) are removed. As shown in FIG. 6H, the profile of each first trench 111 in the first region R1 is different from the profile of each second trench 112 in the second region R2 as a result of the loading effect. More specifically, the depth of each second trench 112 is usually larger than that of each first trench 111, and the slope of the second inclined surface 111s2 is usually larger than the slope of the fourth inclined surface 112s4. As the steps in FIGS. 6F to 6H are similar to those in FIGS. 6C to 6E, detailed descriptions thereof will be omitted.

Figure 6I:
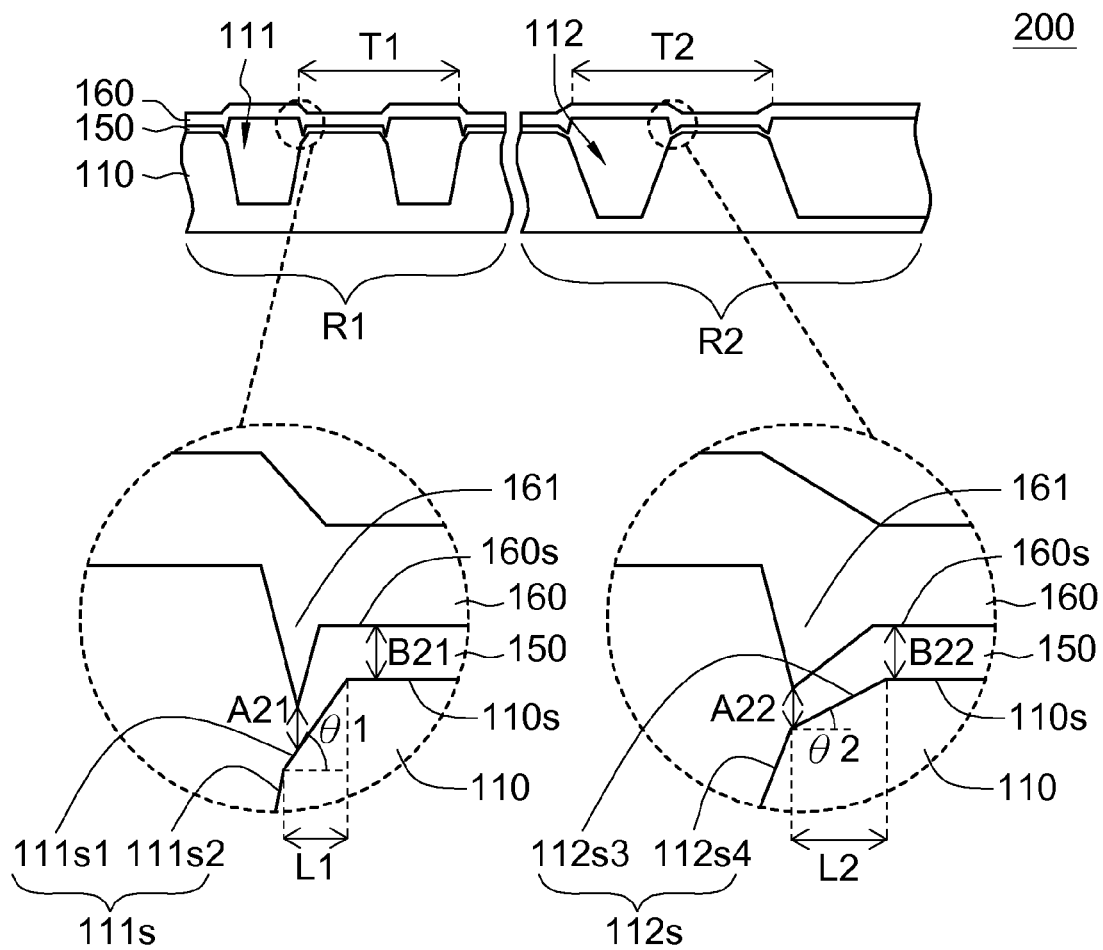

Then, the steps similar to the steps s113~s117 in FIG. 3 are performed to form an isolation structure 200, as shown in FIG. 6I.

The structural features of the isolation structure 200 (FIG. 6I) formed by the formation method mentioned above will be disclosed in the following. The first trenches 111 and the second trenches 112 of the isolation structure 200 are located in the first region R1 and the second region R2 of the substrate 110, respectively. An interval between two adjacent first trenches 111 is different from that between two adjacent second trenches 112. In the present embodiment, the lengths L1 of the first trenches 111 and the lengths L2 of the second trenches 112 can be both greater than 15 nanometers, and the lengths L1 and L2 can be designed to be the same value or different values according to the requirements. In general, compared with the first region R1 (e.g., the array area of the memory structure), many manufacturing steps are performed on the second region R2 (e.g., the periphery area of the memory structure), so that the structure in the second region R2 tends to be slightly damaged. Thus, the length L2 of the second trench 112 in the second region R2 can be formed to be greater than the the length L1 of the first trench 111 in the first region R1.

In addition, the dimensions of the isolation structure 200 can reach the following specification according to the thickness control of the first removable layer 131 (see FIG. 6C) and the second removable layer 132 (see FIG. 6F). The isolation structure 200 is a periodic structure with two different pitches, wherein the pitch in the first region R1 (e.g., the array area of the memory structure) is designated as T1, and the pitch in the second region R2 (e.g., the periphery area of the memory structure) is designated as T2, as shown in FIG. 6I.

A ratio of the length L1 of the first inclined surface 111s1 of each first trench 111 in the first region R1 to the pitch T1 can be greater than 0.06, and an angle θ1 between the first inclined surface 111s1 and the horizontal plane ranges between 0 and 60 degrees. A ratio of the length L2 of the third inclined surface 112s3 of each second trench 112 in the second region R2 to the pitch T2 can be greater than 0.01, and an angle θ2 between the third inclined surface 112s3 and the horizontal plane ranges between 0 and 60 degrees.

The dielectric layer 150 is on the first trenches 111 and the second trenches 112. More specifically, the dielectric layer 150 covers over the substrate 110 and is filled into the first trenches 111 and the second trenches 112. The conductive layer 160 is on the dielectric layer 150. The lower surface 160s of the conductive layer 160 has the projections 161, each of which protrudes toward the substrate 110. The projections 161 in the first region R1 surround at the position corresponding to the first inclined surface 111s1, and the projections 161 in the second region R2 surround at the position corresponding to the third inclined surface 112s3. In the first region R1, if the distance between the projection 161 and the first inclined surface 111s1 is A21 and the distance between the upper surface 110s of the substrate 110 and the lower surface 160s of the corresponding conductive layer 160 is B21, A21/B21 can reach 70% to 80%. In the second region R2, if the distance between the projection 161 and the third inclined surface 112s3 is A22 and the distance between the upper surface 110s of the substrate 110 and the lower surface 160s of the corresponding conductive layer 160 is B22, A22/B22 can reach 70% to 80%. Therefore, compared with the structure shown in FIG. 1B, the dielectric layer 150 can be distributed more uniformly in either the first region R1 or the second region R2 to prevent the top corner thinning, so that the current leakage can be avoided and the memory device having the isolation structure 200 has excellent reliability.

In addition, the first removable layer 131 and the second removable layer 132 can be removed from the sides 120s of the mask layer 120. Thus, the aspect ratio of each first trench 111 and that of each second trench 112 can be effectively controlled. Thus, the block of the dielectric layer 150 at the openings of the first trenches 111 and the second trenches 112 can be avoided, so that the possibility of forming voids in the first trenches 111 and the second trenches 112 can be reduced.

Fourth Embodiment

The difference between the fourth embodiment and the third embodiment resides in the structure of each spacer structure with a removable layer and a spacer layer and the formation method thereof. The same components will refer to the same numbers and detailed descriptions thereof will be omitted.

FIGS. 7A to 7I show processes of a formation method of an isolation structure according to a fourth embodiment of the invention. The isolation structure of this embodiment can be formed in memory structures to provide the insulation function. The formation method of the isolation structure includes the following steps. Some steps in the embodiment which are similar to those in the third embodiment are not described in detail herein.

Figure 7A:
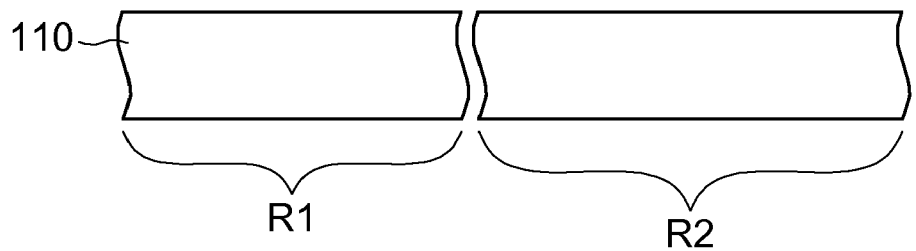
FIGS. 7A to 7I show processes of a formation method of an isolation structure according to a fourth embodiment of the invention.

First, as shown in FIG. 7A, a substrate 110 is provided. The substrate 110 is divided into a first region R1 (e.g., the array area in the memory structure) and a second region R2 (e.g., the periphery area of the memory structure).

Figure 7B:
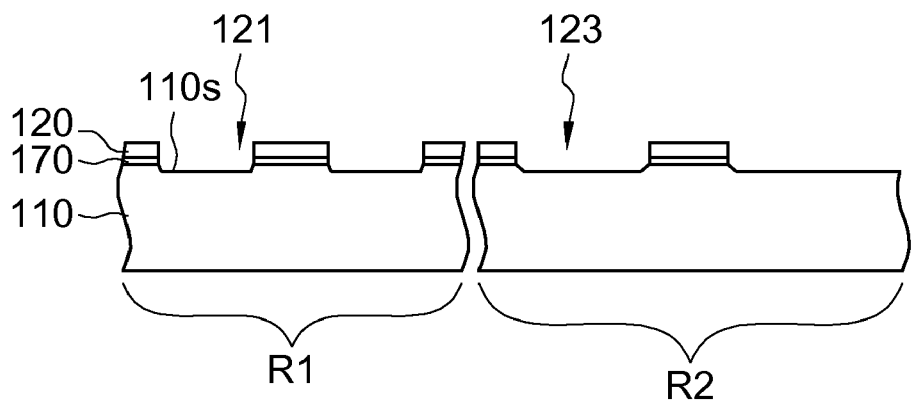

Next, a buffer layer 170 and a mask layer 120 are sequentially formed on the substrate 110, as shown in FIG. 7B. The buffer layer 170 and the mask layer 120 have first openings 121 and second openings 123.

Figure 7C:
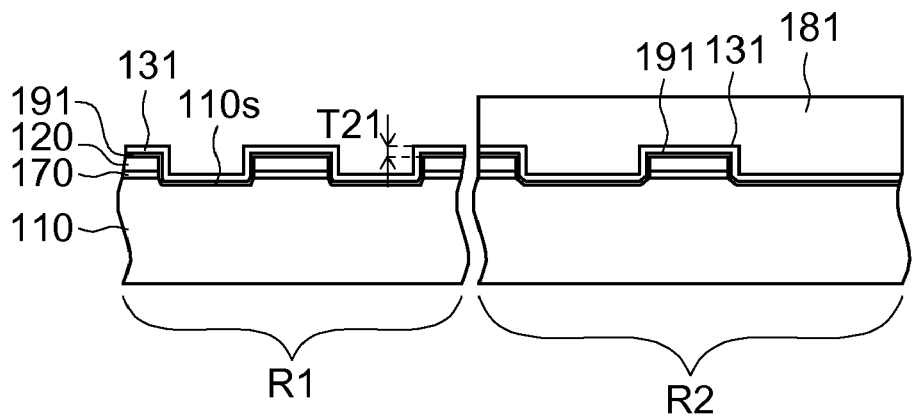

Then, as shown in FIG. 7C, a spacer layer 191 and a first removable layer 131 are sequentially formed on the mask layer 120 and a portion of the upper surface 110s of the substrate 110. The total thickness of the spacer layer 191 and the first removable layer 131 is thickness T21. The spacer layer 191 is composed of, for example, oxide. Next, in order to perform the step of forming first trenches in the first region R1 of the substrate 110, a first photoresist layer 181 is formed to cover over the second region R2.

Figure 7D:
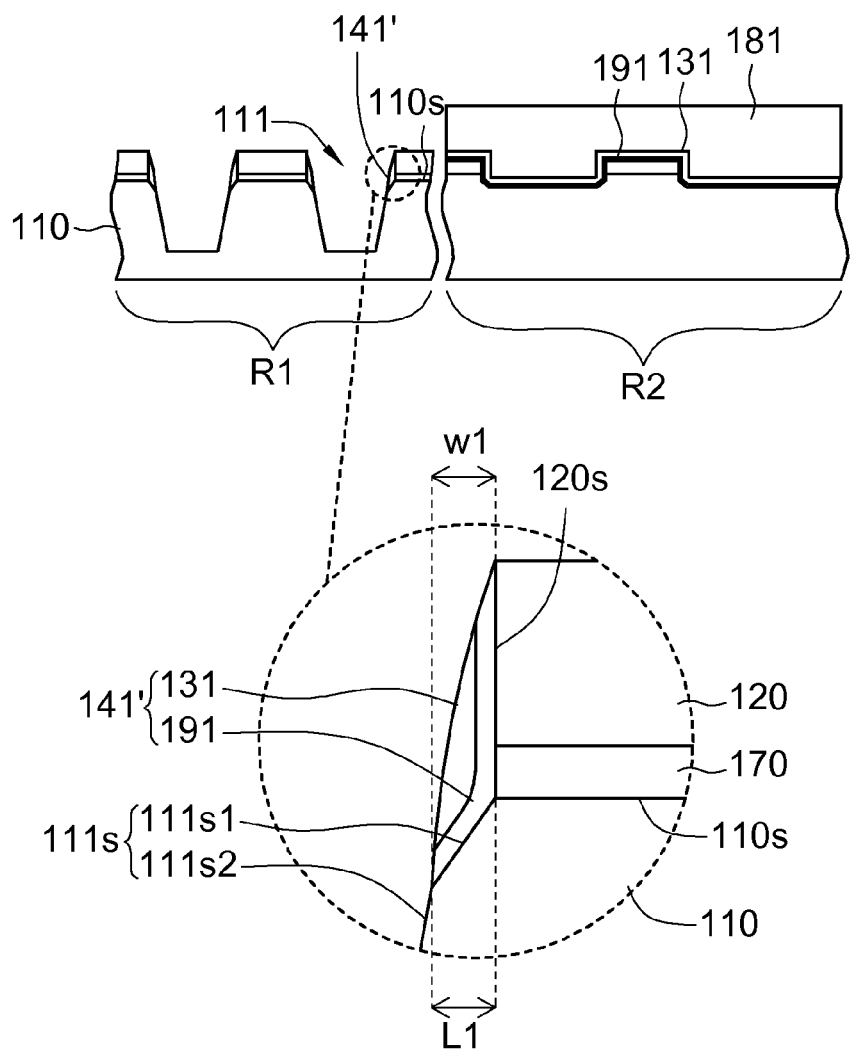

Next, as shown in FIG. 7D, an anisotropic etching process is performed in the first region R1, so that first spacer structures 141' including the residual spacer layer 191 and the residual first removable layer 131 are formed on sides 120s of the mask layer 120, and the first trenches 111 are formed in the substrate 110. A sidewall 111s of each first trench 111 has a first inclined surface 111s1, covered by the first spacer structure 141', and an exposed second inclined surface 111s2. The width w1 of each first spacer structure 141' can be greater than 150 angstroms as the thickness T21 of the first removable layer 131 is greater than 150 angstroms, so that the length L1 of the first inclined surface 111s1 can be greater than 15 nanometers. In the present embodiment, the length L1 of the first inclined surface 111s1 is defined as the length that the first inclined surface 111s1 is project onto the horizontal plane.

Figure 7E:
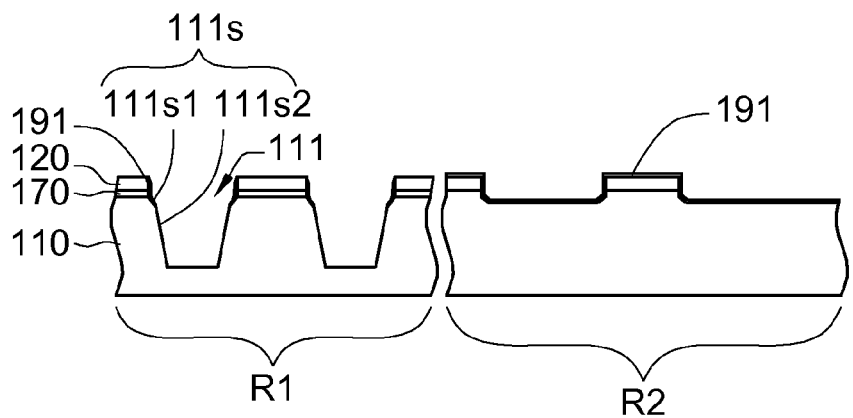

Then, the residual first removable layer 131 and the first photoresist layer 181 are removed, as shown in FIG. 7E.

Herein, the removed residual first removable layer 131 refers to the first removable layer 131 included in the first spacer structures 141', and the first removable layer 131 in the second region R2. The residual spacer layer 191 is not removed, but it is still located on the sides 120s of the mask layer 120 to cover the first inclined surface 111s1 of the first trench 111 and to be located in the second region R2 of the substrate 110. Generally speaking, the surface of the trench (i.e. the surface of the exposed substrate) is repaired and improved by covering a liner layer thereon.

Figure 7F:
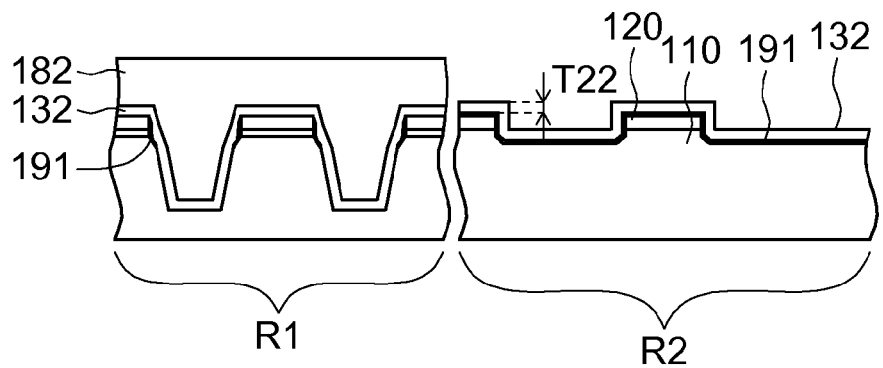
Figure 7G:
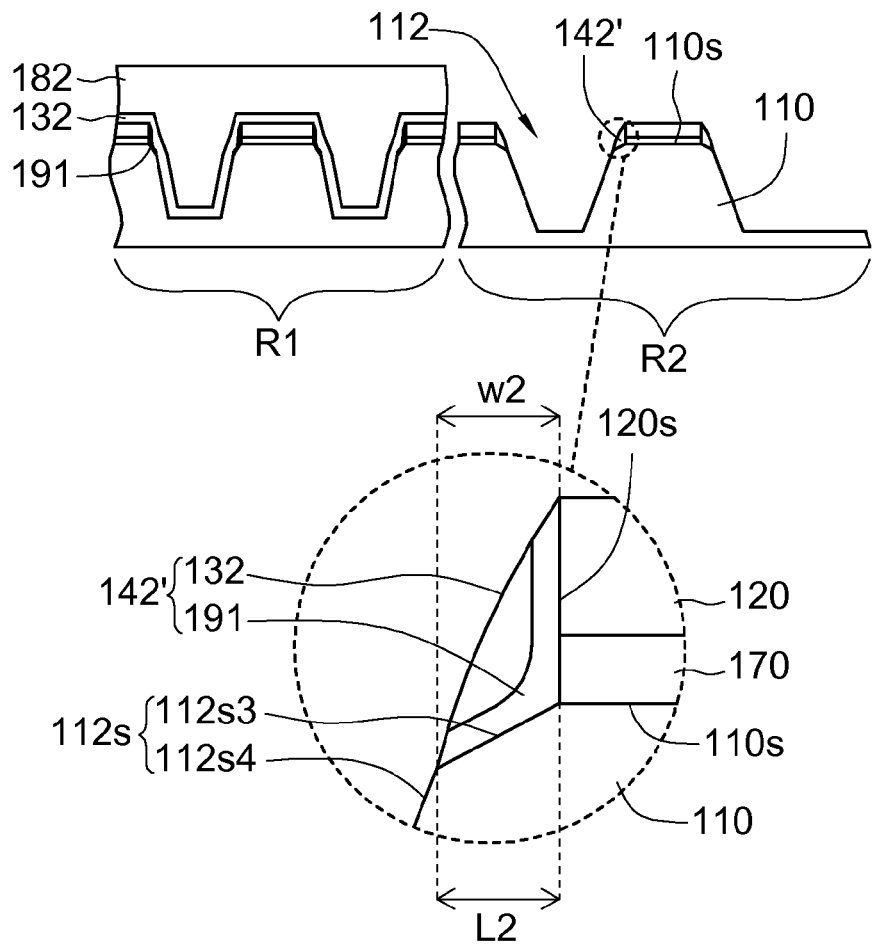
Figure 7H:
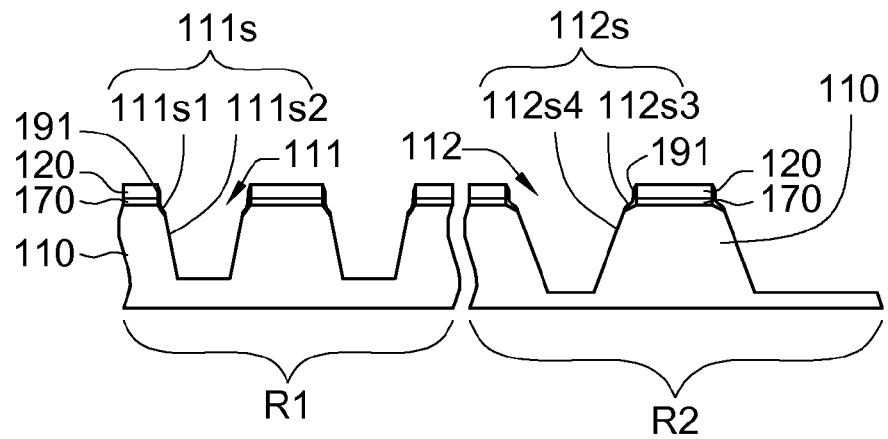

Next, forming second trenches in the second region R2 of the substrate 110 includes the following steps. As shown in FIG. 7E, the structure in the second region R2 has the residual spacer layer 191. A second removable layer 132 is directly formed and a second photoresist layer 182 is formed in the first region R1, as shown in FIG. 7F. Herein, the total thickness of the spacer layer 191 and the second removable layer 132 is thickness T22. Next, an anisotropic etching process is performed in the second region R2, so that second spacer structures 142' having the second width w2 and including the residual spacer layer 191 and the residual second removable layer 132 are formed on the sides 120s of the mask layer 120, and the second trenches 112 are formed in the substrate 110, as shown in FIG. 7G. A sidewall 112s of each second trench 112 has a third inclined surface 112s3, covered by the second spacer structure 142', and an exposed fourth inclined surface 112s4. The width w2 of each second spacer structure 142' can be greater than 15 nanometers as the thickness T22 of the spacer layer 191 and the second removable layer 132 is greater than 150 angstroms, so that the length L2 of the third inclined surface 112s3 can be greater than 15 nanometers. In the present embodiment, the length L2 of the third inclined surface 112s3 is defined as the length that the third inclined surface 112s3 is project onto the horizontal plane. Of course, a person having ordinary skills in the art understands that the length L2 can be different from the length L1 by adjusting the thickness T22. Then, as shown in FIG. 7H, the second photoresist layer 182 and the residual second removable layer 132 are removed. Herein, the removed residual second removable layer 132 refers to the second removable layer 132 included in the second spacer structures 142' and in the first region R1. The residual spacer layer 191 is not removed, but it is still located on the sides 120s of the mask layer 120 to cover the first inclined surface 111s1 of the first trench 111 and cover the third inclined surface 112s3 of the second trench 112.

Figure 7I:
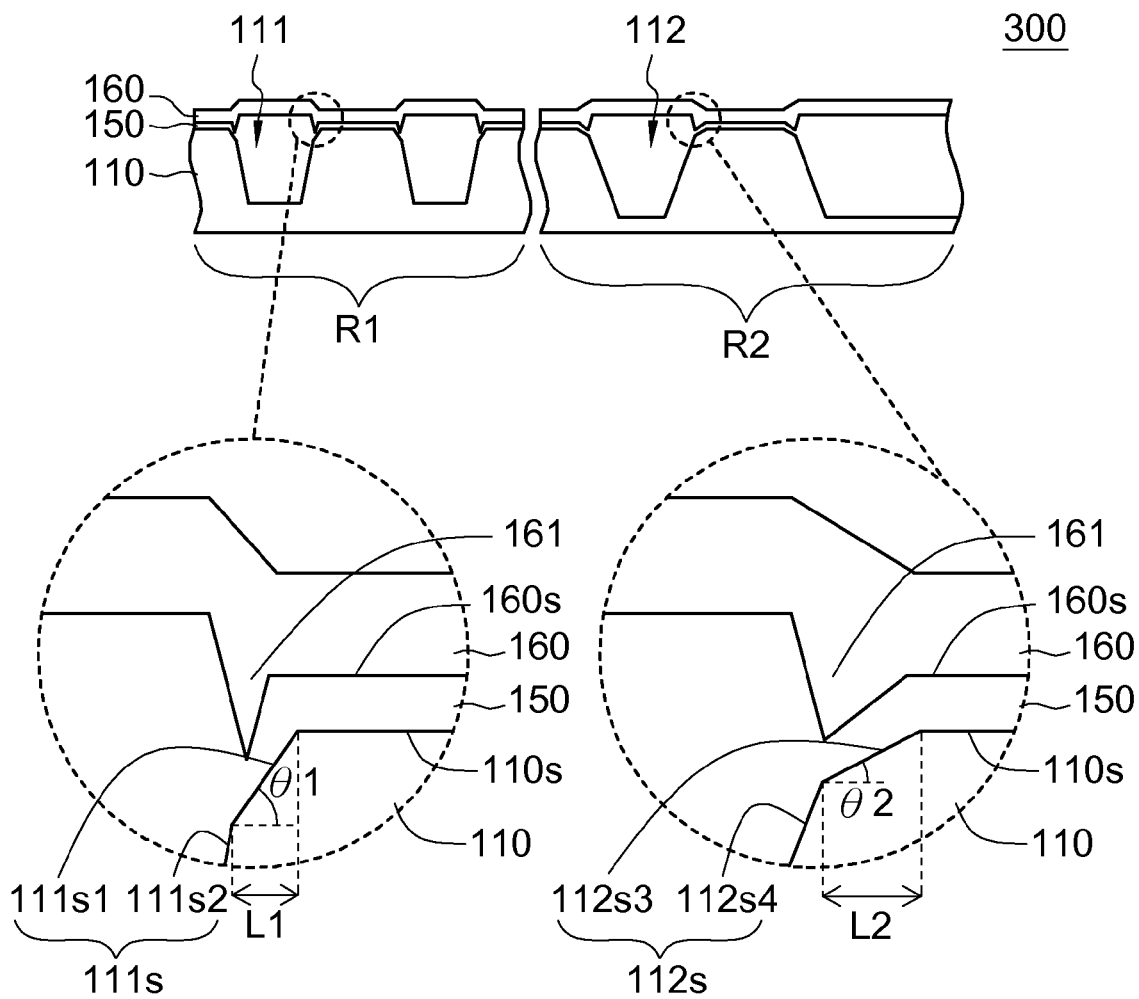

Thereafter, the steps similar to the steps s113~s117 in FIG. 3 are performed to form an isolation structure 300, as shown in FIG. 7I. The lower surface 160s of the conductive layer 160 has projections 161, each of which protrudes toward the substrate 110. The projections 161 in the first region R1 surround at the position corresponding to the first inclined surface 111s1, and the projections 161 in the second region R2 surround at the position corresponding to the third inclined surface 112s3.

The structural features of the isolation structure 300 (FIG. 7I) formed by the formation method mentioned above will be discloses in the following. In this embodiment, the spacer layer 191 is still located on the sides 120s of the mask layer 120 in the step of filling the dielectric layer 150. However, as long as the total thickness of the removable layer and the spacer layer is appropriately controlled to prevent the aspect ratio of each trench from extremely increasing, the step of filling the material of the dielectric layer 150 via the openings can be performed without blocking at the openings. Thus, the block of the dielectric layer 150 at the openings of the first trenches 111 and the second trenches 112 (the fill-in issue) can be avoided, so that the possibility of forming voids in the first trenches 111 and the second trenches 112 can be reduced.

In addition, the ratios of the distances between the projections 161 and the first inclined surface 111s1 and the third inclined surface 112s3 to the distances between the upper surface 110s of the substrate 110 and the lower surface 160s of its corresponding conductive layer 160 in either the first region R1 or the second region R2 can reach 70% to 80%. Therefore, compared with the structure shown in FIG. 1B, the dielectric layer 150 can be distributed more uniformly in either the first region R1 or the second region R2 to prevent the top corner thinning, so that the current leakage can be avoided and the memory device having the isolation structure 300 has excellent reliability.

In this embodiment, the total thickness of the spacer layer and the first removable layer in the first region is used for controlling the length of the first inclined surface of the first trench. In the second region, the length of the third inclined surface of the second trench is controlled by the total thickness of the residual spacer layer and the second removable layer formed thereon. However, a person having ordinary skills in the art understands that the methods for controlling the length of the first inclined surface and that of the third inclined surface are not limited thereto. In another embodiment, the length of the first inclined surface of the first trench can be controlled only by the thickness of the spacer layer in the first region. In the second region, the length of the third inclined surface can be controlled by the total thickness of the residual spacer layer and the removable layer formed thereon. Alternatively, the length of the first inclined surface can be controlled by the total thickness of the spacer layer and the first removable layer in the first region. In the second region, the length of the third inclined surface can be controlled only by the thickness of the residual spacer layer. According to the examples stated above, the length of the first inclined surface and the length of the third inclined surface can be formed to be the same as or different from each other according to the requirements.

In the isolation structure and the formation method thereof according to each embodiment of the invention, the width of the spacer structure is changed by adjusting the thickness of the removable layer, so that the length of the inclined surface can be correspondingly adjusted. Therefore, the dielectric layer on the substrate can be uniformly distributed to prevent the current leakage from being generated due to the top corner thinning. Of course, the length of the inclined surface can be adjusted by the overall thickness of the spacer layer and the removable layer formed thereon. In addition, the aspect ratio of each trench can be effectively controlled because of the use of the removable material. Thus, the block of the dielectric layer at the openings of the trenches can be avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An isolation structure, comprising:
   a plurality of trenches in a substrate, wherein a sidewall of each of the trenches has a first inclined surface and a second inclined surface, the first inclined surface is located on the second inclined surface, the slope of the first inclined surface is different from the slope of the second inclined surface, and a length of the first inclined surface is greater than 15 nanometers, the substrate has a first region and a second region, a length that the first inclined surface of each of the trenches is projected onto a horizontal plane in the first region is a first horizontal length, a length that the first inclined surface of each of the trenches is projected onto the horizontal plane in the second region is a second horizontal length, the first horizontal length is different from the second horizontal length.

2. The isolation structure according to claim 1, further comprising:
a dielectric layer on the trenches; and
a conductive layer on the dielectric layer, wherein a lower surface of the conductive layer has a projection, and the projection protrudes toward the substrate and surround at a position which corresponds to the first inclined surface.

3. The isolation structure according to claim 1, wherein an angle between the first inclined surface and a horizontal plane ranges between 0 and 60 degrees.

4. The isolation structure according to claim 1, wherein a ratio of the length of the first inclined surface to a pitch of the isolation structure is greater than 0.06, and an angle between the first inclined surface and a horizontal plane ranges between 0 and 60 degrees.

5. The isolation structure according to claim 1, wherein an interval between two adjacent trenches in the first region is different from an interval between the two adjacent trenches in the second region.

6. The isolation structure according to claim 1, wherein the slope of the first inclined surface is smaller than the slope of the second inclined surface.

* * * * *